(12) United States Patent
Lin et al.

(10) Patent No.: US 10,310,652 B2
(45) Date of Patent: Jun. 4, 2019

(54) TOUCH DISPLAY DEVICE WITH REFLECTION REDUCING LAYER

(71) Applicant: InnoLux Corporation, Miao-Li County (TW)

(72) Inventors: Hsiao-Lang Lin, Miao-Li County (TW); Jui-Jen Yueh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/670,129

(22) Filed: Aug. 7, 2017

(65) Prior Publication Data

US 2018/0188862 A1 Jul. 5, 2018

Related U.S. Application Data

(60) Provisional application No. 62/441,579, filed on Jan. 3, 2017.

(51) Int. Cl.
| | |
|---|---|
| *G06F 3/041* | (2006.01) |
| *H01L 27/12* | (2006.01) |
| *H01L 25/16* | (2006.01) |
| *G02F 1/1333* | (2006.01) |

(52) U.S. Cl.
CPC ........ *G06F 3/0412* (2013.01); *G02F 1/13338* (2013.01); *G02F 1/133345* (2013.01); *H01L 25/167* (2013.01); *H01L 27/1218* (2013.01); *H01L 27/1248* (2013.01); *G06F 2203/04102* (2013.01); *G06F 2203/04103* (2013.01)

(58) Field of Classification Search
CPC ............ G06F 3/0412; G02F 1/133345; G02F 1/13338
USPC .......................................................... 345/173
See application file for complete search history.

(56) References Cited

U.S. PATENT DOCUMENTS

| | | | | |
|---|---|---|---|---|
| 2008/0248219 | A1* | 10/2008 | Chang .................... | G02B 1/115 428/1.1 |
| 2009/0135151 | A1* | 5/2009 | Sun ......................... | G06F 3/041 345/173 |
| 2010/0253222 | A1* | 10/2010 | Koshihara ........... | H01L 51/5265 315/32 |
| 2012/0268402 | A1* | 10/2012 | Wang ...................... | G06F 3/041 345/173 |
| 2015/0015530 | A1 | 1/2015 | Kim et al. | |
| 2015/0169094 | A1* | 6/2015 | Liu ...................... | H01L 51/5262 345/173 |

(Continued)

*Primary Examiner* — Jonathan M Blancha
(74) *Attorney, Agent, or Firm* — McClure, Qualey & Rodack, LLP (57) ABSTRACT

A touch display device is provided. The touch display device includes a substrate and a plurality of display units disposed on the substrate, wherein the display units form a display region and the display region has a first outline. The touch display device further includes an insulating layer disposed on the display units and a plurality of touch units disposed on the insulating layer, wherein the touch units form a touch region, and the touch region has a second outline. The touch display device further includes a reflection reducing layer disposed on the touch units, the reflection reducing layer is in contacted with the touch units and has a third outline, wherein the first outline and the second outline are located within the third outline in a view of a first direction perpendicular to the substrate.

19 Claims, 5 Drawing Sheets

(56) References Cited

U.S. PATENT DOCUMENTS

| | | |
|---|---|---|
| 2015/0293560 A1 | 10/2015 | Choi et al. |
| 2015/0301667 A1* | 10/2015 | Yano .................... G06F 3/0412 345/173 |
| 2016/0093817 A1* | 3/2016 | Inoue ................. H01L 51/0085 257/40 |
| 2016/0118416 A1* | 4/2016 | Yamazaki ........... H01L 27/1225 349/38 |
| 2016/0282987 A1 | 9/2016 | Choi et al. |
| 2016/0322444 A1 | 11/2016 | Kang et al. |

* cited by examiner

TOUCH DISPLAY DEVICE WITH REFLECTION REDUCING LAYER

CROSS REFERENCE TO RELATED APPLICATIONS

This application claims the benefit of priority from provisional application no. U.S. Patent Application No. 62/441,579 filed on Jan. 3, 2017 and the entirety of which is incorporated by reference herein.

BACKGROUND

Technical Field

The disclosure relates to a touch display device, and in particular to a touch display device with a reflection reducing layer.

Description of the Related Art

As technology progresses, several information devices are being developed, such as mobile phones, tablet PCs, ultra-thin laptops, and satellite navigation. Except for using a keyboard or mouse for keying in and control, a popular way to control information devices is through touch technology. The touch display device usually has a user-friendly and intuitive user interface, so that users of all ages can operate or control their information devices by using a finger or stylus.

However, since the metal material formed on the touch module or the display module of the touch display device can reflect light, the display quality of the touch display device can be adversely affected. Therefore, a touch display device with a reflection reducing layer which may further improve display quality is needed.

SUMMARY

The present disclosure provides a touch display device, including: a substrate and a plurality of display units disposed on the substrate, wherein the display units form a display region and the display region has a first outline. The touch display device further includes an insulating layer disposed on the display units and a plurality of touch units disposed on the insulating layer, wherein the touch units form a touch region, and the touch region has a second outline. The touch display device further includes a reflection reducing layer disposed on the touch units, the reflection reducing layer is in contacted with the touch units and has a third outline, wherein the first outline and the second outline are located within the third outline in a view of a first direction perpendicular to the substrate.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

The touch display device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed on another layer" may indicate that the layer is directly in contact with the other layer, or that the layer is not directly in contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed within a transparent substrate and the layers overlying the transparent substrate. All transistor element needed may be already formed over the substrate. However, the substrate is represented with a flat surface in order to simplify the drawing. The term "substrate surface" is meant to include the uppermost exposed layers on a transparent substrate, such as an insulating layer and/or metallurgy lines.

The embodiment of the present disclosure provides the touch display device with the reflection reducing layer in contact with the touch units, which in turn improves the display quality of the touch display device.

Figure 1:
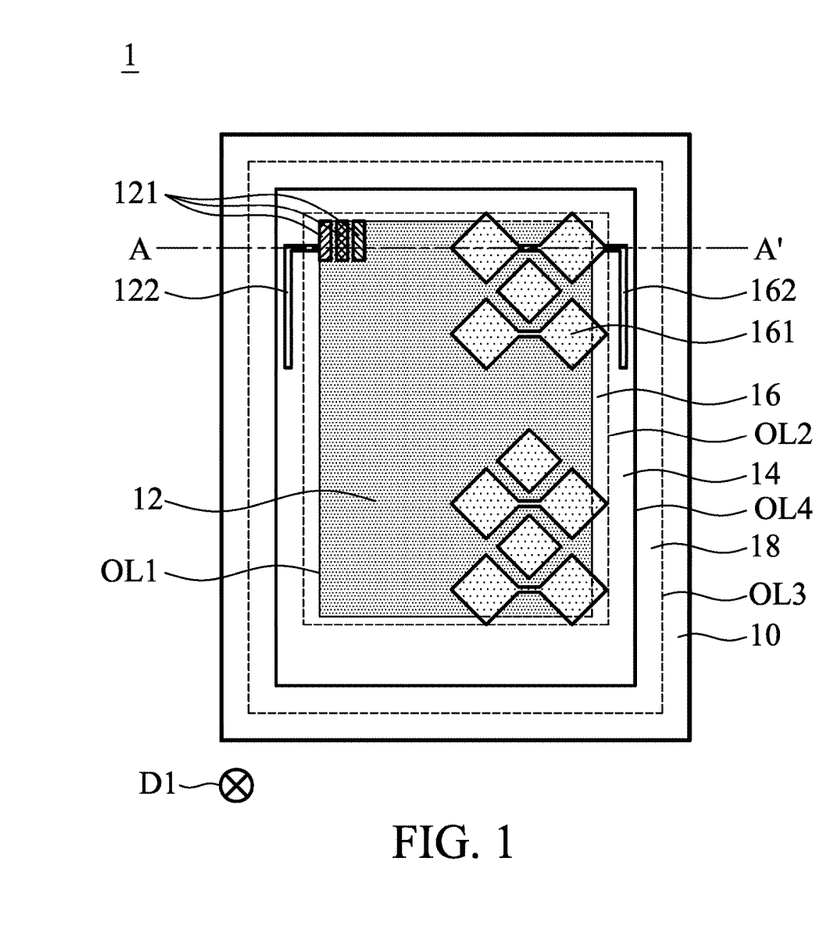
FIG. 1 is a schematic top view of a touch display device in accordance with some embodiments of the present disclosure.
Figure 2:
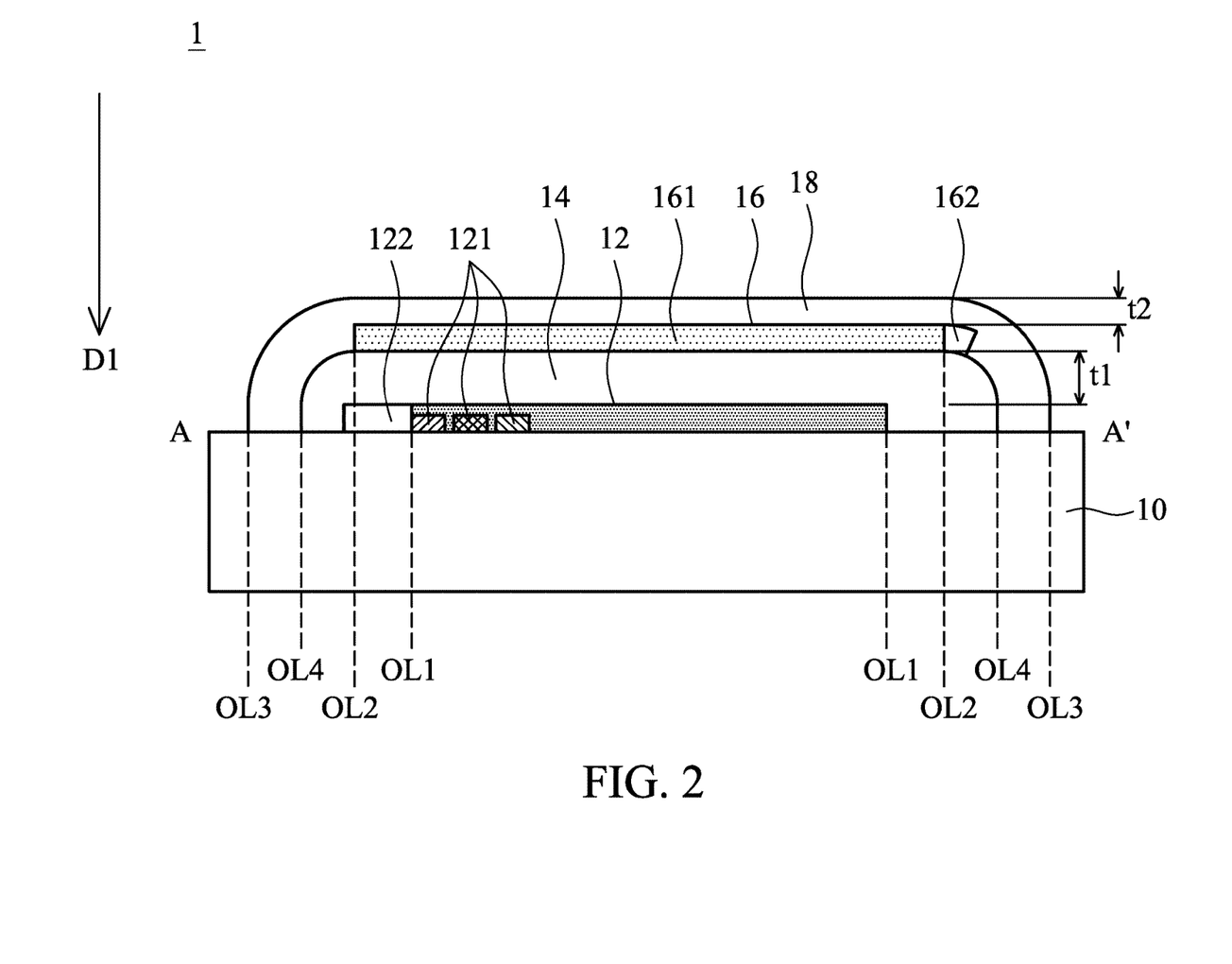
FIG. 2 is a schematic cross-sectional view along line A-A' in FIG. 1 in accordance with some embodiments of the present disclosure.

FIG. 1 is a top view of a touch display device 1, and FIG. 2 is a cross-sectional view along line A-A' in FIG. 1 in accordance with an embodiment of the present disclosure. As shown in FIGS. 1-2, the touch display device 1 includes a substrate 10 having a main surface on which a plurality of display units 121 are arranged. For the sake of simplicity and clarity, only three display units 121 are illustrated in FIGS. 1-2, and driving circuit (e.g., transistors, gate lines, data lines, or capacitance) for the plurality of display units 121 is partially omitted. The material of the substrate 10 may include, but is not limited to, quartz, glass, metal foil, polymethylmethacrylate (PMMA), polyimide (PI), polyethylene terephthalate (PET), polyethylene naphthalate (PEN), and polybutylene naphthalate (PBN). As shown in FIG. 1, the display units 121 form a display region 12 for displaying images and the display units 121 may include, but is not limited to, organic light emitting diodes (OLED), micrometer size inorganic light emitting diodes (micro-LED), liquid crystal sub-pixels (a sub-pixel is a unit with a portion of electrodes and a portion of liquid crystal cell for displaying basic dot). The display region 12 is defined by the outer boundary of the set of display units 121, the outline of display region 12 encloses all display units 121, and all display units 121 are disposed within the display region 12. The shape of the display units 121 could be rhombus, parallelogram, rectangle, square, triangle, circle, or other shapes suitable for displaying and layout arrangement. Furthermore, each of the display units 121 defines a plurality of sub-pixels, such as red sub-pixel, blue sub-pixel and green subpixel, and for example, three sub-pixels can form a pixel. In other embodiments, the display units 121 could be red sub-pixels, blue sub-pixels, green sub-pixels, and white sub-pixels, or the display units 121 could be red sub-pixels, blue sub-pixels, green sub-pixels, and yellow sub-pixels. In addition, the touch display device 1 may further include a plurality of display signal lines 122 electrically connected to the display units 121, such as gate lines and data lines. The touch display device 1 may further include a plurality of circuit elements electrically connected to the display units 121, such as transistor and capacitance.

The touch display device 1 may further include an insulating layer 14 disposed on the display units 121. The material of the insulating layer 14 may include, but is not limited to, organic insulating materials (such as photosensitive resins) or inorganic insulating materials (such as silicon nitride, silicon oxide, silicon oxynitride, silicon carbide, aluminum oxide, or a combination thereof).

The touch display device 1 may further include a plurality of touch units 161 disposed on the insulating layer 14, and the touch units 161 form a touch region 16 for sensing touch events. The touch region is defined by the outer boundary of the set of the touch units 161, the outline of touch region 16 encloses all touch units 161, and all touch units 161 are disposed within the touch region 16. The shape of the touch units 161 could be rhombus, parallelogram, rectangle, square, triangle, circle, or other shapes suitable for touch sensing and layout arrangement. For the sake of simplicity and clarity, only some touch units 161 are illustrated in FIG. 1. The material of the touch units 161 may include, but is not limited to, transparent conductive materials (such as indium tin oxide (ITO), tin oxide (SnO), indium zinc oxide (IZO), indium gallium zinc oxide (IGZO), indium tin zinc oxide (ITZO), antimony tin oxide (ATO), antimony zinc oxide (AZO), or a combination thereof) or metal (such as copper, aluminum, molybdenum, tungsten, gold, cobalt, nickel, platinum, titanium, iridium, rhodium, an alloy thereof, or a combination thereof). In addition, the touch display device 1 may further include a plurality of touch signal lines 162 electrically connected to the touch units 161.

Furthermore, the touch display device 1 may include a reflection reducing layer 18 on the touch units 161 and may in contact with the touch units 161. The reflection reducing layer 18 may covers at least a portion of the touch units 161, at least a portion of the insulating layer 14, and at least a portion of the touch signal lines. The reflection reducing layer 18 may in contact with the substrate.

Still referring to FIG. 1, a top view of a touch display device 1, which is a view of a first direction D1 substantially perpendicular to the substrate 10. It should be noted that, the display region 12 has a first outline OL1 substantially enclosing and surrounding the display units 121. The touch region 16 has a second outline OL2 substantially enclosing and surrounding the touch units 161. The reflection reducing layer 18 has a third outline OL3 substantially corresponding to the edge of the reflection reducing layer 18. In particular, the first outline OL1 and the second outline OL2 are located within the third outline OL3. In addition, the insulating layer 14 has a fourth outline OL4 substantially corresponding to the edge of the insulating layer 14. The fourth outline OL4 is located within the third outline OL3.

Since the first outline OL1 and the second outline OL2 are located within the third outline OL3, namely the display units 121 and the touch units 161 are also located within the reflection reducing layer 18 when viewed along the first direction D1 (in top view). In this way, the anti-reflection is more effective, and the reflection reducing layer 18 could cover whole touch units 161, so the reflection reducing layer 18 also can protect the display units 121 and the touch units 161 from corrosion by the water vapor, whereby the display quality and the reliability of touch display device 1 could be improved.

Referring to FIG. 2, the insulating layer 14 corresponding to the display region 12 has a first thickness t1 in the first direction D1. The reflection reducing layer 18 corresponding to the display region 12 has a second thickness t2 in the first direction D1. In this embodiment, the first thickness t1 is greater than the second thickness t2. In some embodiments, but is not limited to, the first thickness t1 may range from about 2 µm to 50 µm, and the second thickness t2 may range from about 0.05 µm to 2 µm.

As the touch units 161 are disposed on the insulating layer 14 and between the insulating layer 14 and the reflection reducing layer 18, the planarization of the insulating layer 14 is needed. Furthermore, the reflection reducing layer 18 is used for reduce reflection based on the destructive interference, so that the first thickness t1 may be greater than the second thickness t2.

Figure 3:
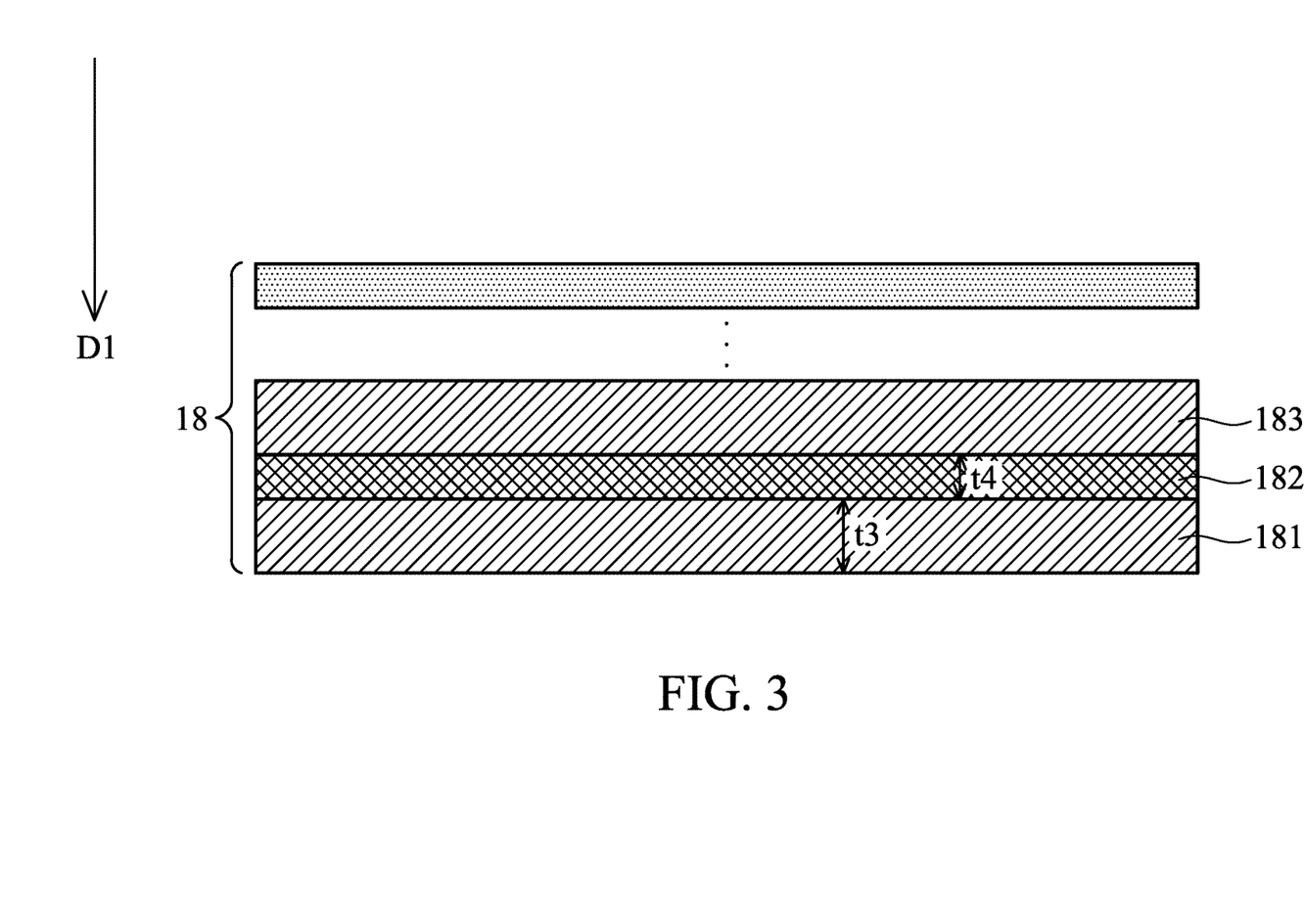
FIG. 3 is a schematic cross sectional view showing a structure of a reflection reducing layer in accordance with some embodiments of the present disclosure.

FIG. 3 is a schematic cross sectional view showing a structure of a reflection reducing layer 18 in accordance with an embodiment of the present disclosure. The reflection reducing layer 18 may include a first layer 181 and a second layer 182. For example, in one embodiment, the first layer 181 is disposed on the touch units 161 by spin coating, physical vapor deposition (PVD), chemical vapor deposition (CVD), or other deposition method, and the first layer 181 is adjacent to the touch units 161 and in contact with the touch units 161. The second layer 182 is disposed on the first layer 181. The first layer 181 corresponding to the display region 12 has a third thickness t3 in the first direction D1 and the second layer 182 corresponding to the display region 12 has a fourth thickness t4 in the first direction D1. In particular, the third thickness t3 is different from the fourth thickness. For example, the third thickness t3 is greater than the fourth thickness. In some embodiments, but is not limited to, the third thickness t3 is ranged from about 15 nm to 80 nm and the fourth thickness t4 is ranged from about 5 nm to 15 nm. The material of the first layer 181 may include, but is not limited to, silicon oxide, silicon nitride, silicon oxynitride, niobium oxide, titanium oxide, zirconium oxide, any other suitable dielectric material, or a combination thereof. The material of the second layer 182 may include, but is not limited to, copper, aluminum, molybdenum, tungsten, gold, silver, cobalt, nickel, platinum, titanium, iridium, rhodium, niobium, chromium, an alloy thereof, any other suitable metal material, or a combination thereof.

Since the material of the second layer 182 may include metal material, the fourth thickness t4 may not be too thick ($\leq 15$ nm) or the transmittance of the touch display device 1 will be adversely affected.

In addition, the reflection reducing layer 18 may include a third layer 183 disposed on the second layer 182. In other words, the second layer 182 is disposed between the first layer 181 and the third layer 183. In some embodiments, but is not limited to, the thickness and the material of the third layer may be similar to the first layer 181.

Figure 4A:
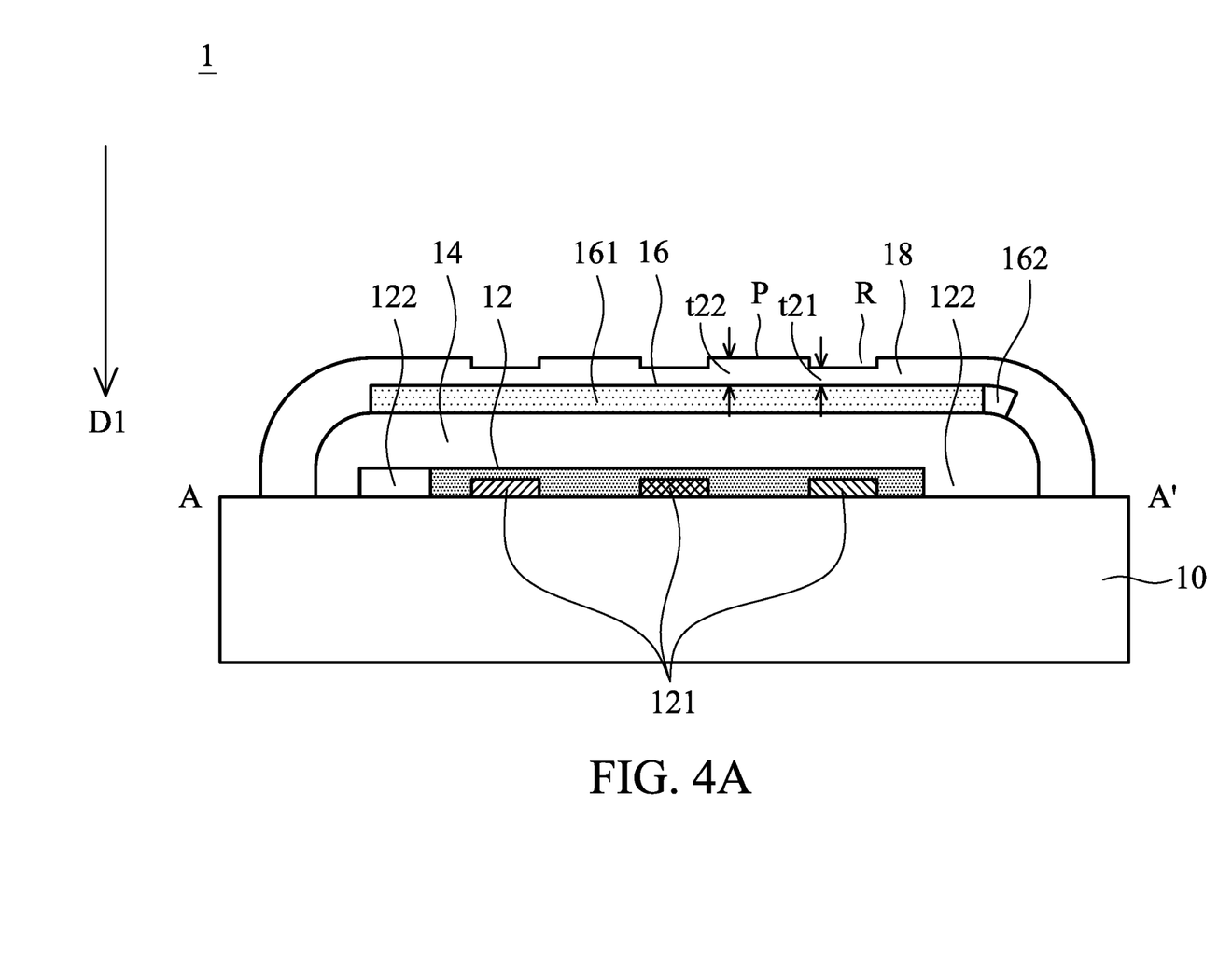
FIG. 4A is a schematic cross sectional view of a touch display device in accordance with some embodiments of the present disclosure.

FIG. 4A is a schematic cross sectional view of a touch display device in accordance with some embodiments of the present disclosure. It should be noted that the reflection reducing layer 18 may include a plurality of recesses R corresponding to the display units 121 in the first direction D1. The reflection reducing layer 18 may further include a plurality of protrusions P. The recesses R and the protrusions P are arranged in alternating positions. For example, there is one protrusion P between each two recesses R, or one recess R between each two protrusions P. In addition, the reflection reducing layer 18 has a fifth thickness t21 corresponding to one of the recesses R on one of the display units 121 in the first direction D1, and the reflection reducing layer 18 has a sixth thickness t22 corresponding to one of the protrusions P in the first direction D1. The fifth thickness t21 is less than the sixth thickness t22.

Figure 4B:
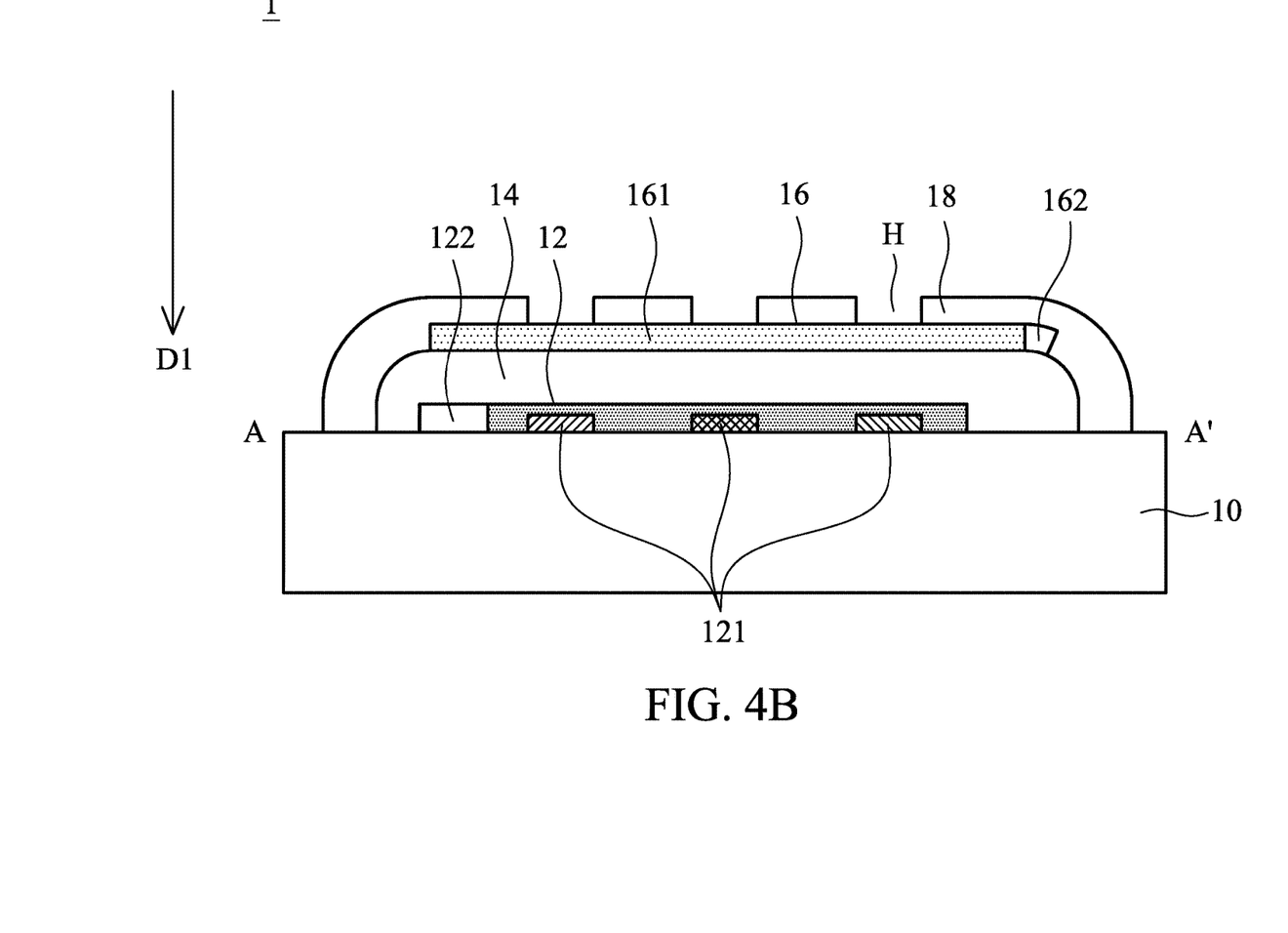
FIG. 4B is a schematic cross sectional view of a touch display device in accordance with some embodiments of the present disclosure.

FIG. 4B is a schematic cross sectional view of a touch display device in accordance with some embodiments of the present disclosure. It should be noted that the reflection reducing layer 18 may include a plurality of through holes H corresponding to the display units 121 in the first direction D1.

Since the reflection reducing layer 18 may include the recesses R or the through holes H corresponding to the display units 121, the transmittance of the touch display device 1 could be improved.

In summary, the present disclosure provides the touch display device 1 with the reflection reducing layer 18 in contact with the touch units 161. In addition, the first outline OL1 of the display region 12 and the second outline OL2 of the touch region 16 are located within the third outline of the reflection reducing layer 18, which in turn improves the display quality of the touch display device.

Note that the above element sizes, element parameters, and element shapes are not limitations of the present disclosure. Those skilled in the art can adjust these settings or values according to different requirements. It is understood that the touch display device and method for manufacturing the same of the present disclosure are not limited to the configurations of FIGS. 1 to 4B. The present disclosure may merely include any one or more features of any one or more embodiments of FIGS. 1 to 4B. In other words, not all of the features shown in the figures should be implemented in the touch display device and method for manufacturing the same of the present disclosure.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A touch display device, comprising:
   a substrate;
   a plurality of display units, disposed on the substrate and forming a display region, wherein the display region has a first outline;
   an insulating layer, disposed on the display units and covering the plurality of display units;
   a plurality of touch units, disposed on the insulating layer and forming a touch region, wherein the touch region has a second outline; and
   a reflection reducing layer, disposed on the touch units and in contact with the touch units, wherein the reflection reducing layer has a third outline;
   wherein the first outline and the second outline are located within the third outline in a view of a first direction perpendicular to the substrate, and the insulating layer is in contact with a portion of the substrate,
   wherein the reflection reducing layer is in contact with at least a portion of the insulating layer and at least a portion of the substrate.

2. The touch display device of claim 1, wherein the insulating layer has a first thickness in the first direction, the reflection reducing layer has a second thickness in the first direction, and the first thickness is greater than the second thickness.

3. The touch display device of claim 2, wherein the first thickness ranges from 2 μm to 50 μm.

4. The touch display device of claim 2, wherein the second thickness ranges from 0.05 μm to 2 μm.

5. The touch display device of claim 1, wherein the reflection reducing layer is in contact with at least a portion of the insulating layer and at least a portion of the substrate.

6. The touch display device of claim 5, wherein the third thickness is greater than the fourth thickness.

7. The touch display device of claim 5, wherein the first layer comprises silicon oxide, silicon nitride, silicon oxynitride, niobium oxide, titanium oxide, zirconium oxide, or a combination thereof.

8. The touch display device of claim 5, wherein the second layer comprises copper, aluminum, molybdenum, tungsten, gold, silver, cobalt, nickel, platinum, titanium, iridium, rhodium, niobium, chromium, an alloy thereof, or a combination thereof.

9. The touch display device of claim 5, wherein the third thickness ranges from 15 nm to 80 nm.

10. The touch display device of claim 5, wherein the fourth thickness ranges from 5 nm to 15 nm.

11. The touch display device of claim 5, wherein the reflection reducing layer further comprises a third layer, and the second layer is disposed between the first layer and the third layer.

12. The touch display device of claim 11, wherein the third layer comprises silicon oxide, silicon nitride, silicon oxynitride, niobium oxide, titanium oxide, zirconium oxide, or a combination thereof.

13. The touch display device of claim 11, wherein the third layer has a thickness ranging from 15 nm to 80 nm.

14. The touch display device of claim 1, wherein the reflection reducing layer comprises a plurality of recesses located corresponding to the display units.

15. The touch display device of claim 14, wherein the reflection reducing layer comprises a plurality of protrusions, and the protrusions and the recesses are arranged in alternating positions.

16. The touch display device of claim 15, wherein the reflection reducing layer has a fifth thickness corresponding to one of the recesses in the first direction and a sixth thickness corresponding to one of the protrusions in the first direction, and the fifth thickness is less than the sixth thickness.

17. The touch display device of claim 1, wherein the reflection reducing layer comprises a plurality of through holes located corresponding to the display units.

18. The touch display device of claim 1, wherein the insulating layer has a fourth outline, and the fourth outline is located within the third outline in the view of the first direction.

19. The touch display device of claim 1, wherein the display units comprise organic light emitting diodes, micro light emitting diodes, or liquid crystal.

* * * * *